United States Patent [19]

Fang

[11] Patent Number: 4,620,117
[45] Date of Patent: Oct. 28, 1986

[54] BALANCED CMOS LOGIC CIRCUITS

[75] Inventor: Sheng Fang, San Antonio, Tex.

[73] Assignee: Advanced Micro Devices, Inc., Sunnyvale, Calif.

[21] Appl. No.: 688,781

[22] Filed: Jan. 4, 1985

[51] Int. Cl.[4] .................. H03K 19/094; H03K 19/20; H03K 19/21; H03K 19/017

[52] U.S. Cl. .................................. 307/451; 307/443; 307/279; 307/471

[58] Field of Search ............... 307/443, 448, 450, 451, 307/452, 279, 471

[56] References Cited

U.S. PATENT DOCUMENTS 4,350,905  9/1982  Sato .............................. 307/449 X
4,367,420  1/1983  Foss et al. ........................... 307/453

OTHER PUBLICATIONS

Griffin et al., "Wired OR and AND Circuits for CVS and CMOS Logic"; *IBM-TDB*; vol. 27, No. 6, pp. 3200-3201; 11/1984.
"High Speed CVS Circuit"; Research Disclosure, May 1984, No. 241; Kenneth Mason Publications Ltd., England.

*Primary Examiner*—Larry N. Anagnos
*Attorney, Agent, or Firm*—Patrick T. King; Davis Chin; J. Vincent Tortolano

[57] ABSTRACT

A logic gate circuit composed of CMOS transistors includes at least a first pair of transistors formed of first and second transistors of one conductivity type having gate, source and drain electrodes. The logic gate circuit further includes at least a second pair of transistors formed of third and fourth transistors of the same conductivity as the first pair and having gate, source and drain electrodes. The source and drain electrodes of the first and second pairs are adapted to receive input signals. A pair of cross-coupled transistors formed of fifth and sixth transistors of a complementary electrodes are provided. The gate of the fifth transistor is connected to the drain of the sixth transistor, and the gate of the sixth transistor is connected to the drain of the fifth transistor. The drain of the fifth transistor is further connected to the drains of the first and second transistors and to a true output terminal. The drain of the sixth transistor is further connected to the drains of the third and fourth transistors and to a complement output terminal. All of the first through sixth transistors are arranged on an integrated circuit substrate with topological regularity.

10 Claims, 17 Drawing Figures

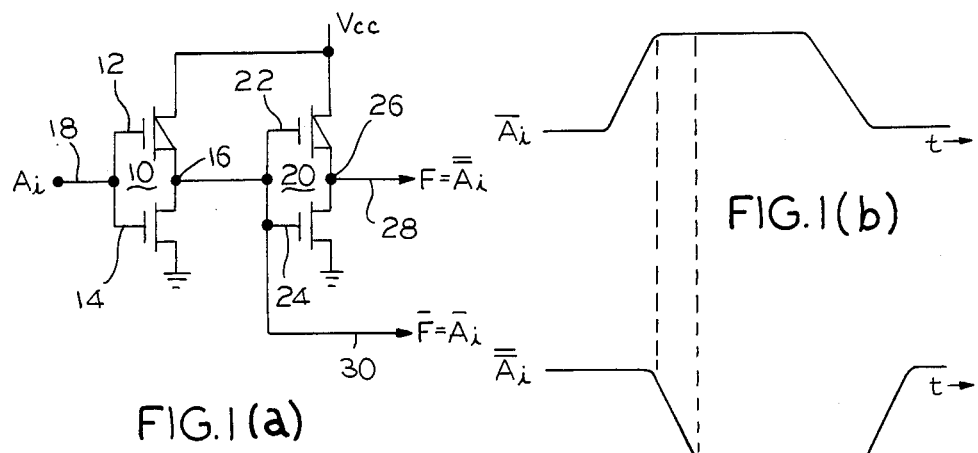
FIG.1(a)
FIG.1(b)
FIG.1(c)
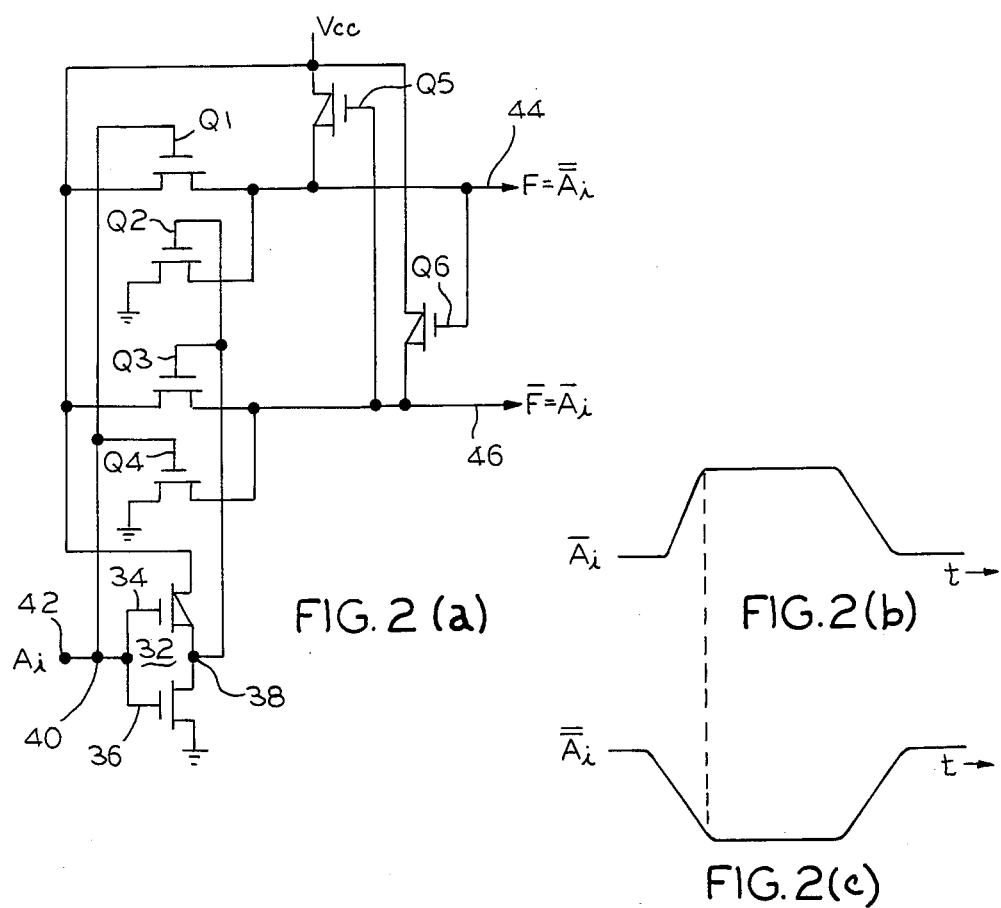
FIG.2(a)
FIG.2(b)
FIG.2(c)

4,620,117

BALANCED CMOS LOGIC CIRCUITS

BACKGROUND OF THE INVENTION

This invention relates generally to complementary metal-oxide-semiconductor (CMOS) integrated circuits and more particularly, it relates to balanced CMOS logic circuits which are arranged on an integrated circuit substrate with topological regularity.

Heretofore, conventional CMOS circuits have been laid out on integrated substrates in a random topological manner which occupies a considerable amount of space area on the substrate. Due to this random layout, the architecture of the prior art circuits require an increased number of interconnecting leads between the various individual circuit elements as well as a high number of power leads which run in an inefficient manner throughout the circuits. As a consequence, the prior art conventional CMOS suffered from the disadvantages of slower speed of operation and high manufacturing cost.

It would therefore be desirable to provide balanced CMOS logic circuits which are arranged on an integrated circuit substrate with topological regularity so as to require a lesser amount of integrated surface area. By utilizing an integrated circuit with reduced surface area, the implementation of various logic circuits on the substrate will minimize the operating load routing requirements which will improve the speed and efficiency of operation of the circuit.

As used herein, "topological regularity" refers to a layout conforming to a repeatable pattern suitable for high-density large scale integration (LSI). As should be apparent to those skilled in the art, custom designed logic circuit chips for LSI are expensive and require high usage for justification. Thus, it would be more expedient to design a particular type of logic circuit which could be used as a standard module. Then, the standard module would be layed out repeatedly on the integrated circuit substrate so as to yield high packing density without increasing the size disproportionately.

SUMMARY OF THE INVENTION

Accordingly, it is a general object of the present invention to provide balance CMOS logic circuits which are arranged on an integrated circuit substrate with topological regularity so as to require a lesser amount of surface area.

It is an object of the present invention to provide balanced CMOS logic circuits which have a high speed of operation.

It is still another object of the present invention to provide balanced CMOS logic circuits which include a pair of cross-coupled P-channel type MOS transistors whose drains form the respective true and complement output terminals.

It is yet still another object of the present invention to provide balanced CMOS logic circuits in which true and complement output signals are generated essentially at the same time.

In accordance with these aims and objectives, the present invention is concerned with the provision of a logic gate circuit composed of CMOS transistors which includes at least a first pair of transistors formed of a first and second transistor of one conductivity type having gate, source and drain electrodes. The logic gate circuit includes at least a second pair of transistors formed of a third and fourth transistors of the same conductivity type as the first pair and having gate, source and drain electrodes.

The source and gate electrodes of the first and second pairs of transistors are adapted to receive input signals. A pair of cross-coupled transistors formed of a fifth and sixth transistors of a complementary conductivity type are provided. The gate of the fifth transistor is connected to the drain of the sixth transistor, and the gate of the sixth transistor is connected to the drain of the fifth transistor. The drain of the fifth transistor is also connected to a true output terminal, and the drain of the sixth transistor is also connected to a complement output terminal. True and complement signals are generated at the respective true and complement output terminals at the same time.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1(a) is a schematic diagram showing a buffer circuit formed of conventional CMOS gate circuits;

FIGS. 1(b) and 1(c) are illustrations of waveforms used in the explanation of FIG. 1(a);

FIG. 2(a) is a schematic diagram showing a buffer circuit formed of balanced CMOS gate circuits, according to the present invention;

FIGS. 2(b) and 2(c) are illustrations of waveforms used in the explanation of FIG. 2(a);

DESCRIPTION OF THE PREFERRED EMBODIMENTS

Figure 3:
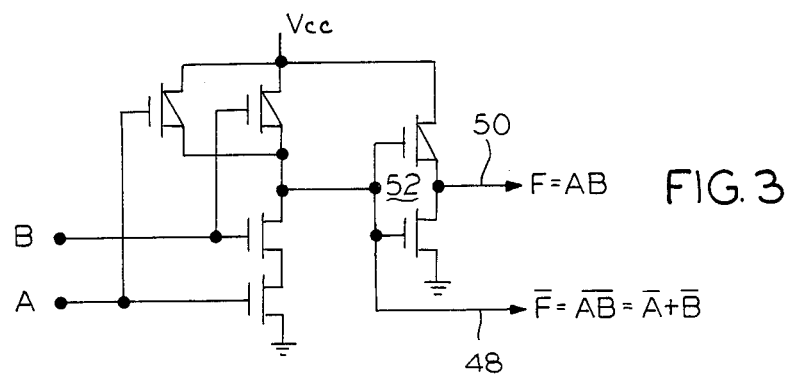
FIG. 3 is a schematic diagram showing an AND logic gate circuit formed of conventional CMOS gate circuits.

Referring now in detail to the various views of the diagram, there is shown in FIG. 1(a) a conventional CMOS (Complementary-Metal-Oxide Semiconductor) buffer circuit of the prior art and has been labeled "Prior Art". This is a well-known circuit where A represents an input and where $F = A_i$ and $\overline{F} = \overline{A}_i$ represent non-inverted and inverted outputs, respectively. A first stage gate 10 is composed of a P-channel transistor 12 and a N-channed transistor 14 which are coupled together to act as a CMOS inverter gate. Node 16 will maintain an inverted logic state with respect to the input logic signal A applied to line 18. A second stage gate 20 is composed of a P-channel transistor 22 and a N-channel transistor 24 which are coupled together to act as another CMOS inverter gate. The node 26 will maintain an inverted logic state with respect to the node 16. The node 26 is connected to the non-inverting output F at line 28, and the node 16 is connected to the inverting output F at line 30.

FIGS. 1(b) and 1(c) illustrate the waveforms appearing at the outputs on the respective lines 28 and 30. As can be seen, the inverting output signal $\overline{F}$ on line 30 will be appearing before the non-inverting signal F on line 28 due to the inherent propagation delay in going through the second stage gate 20. Thus, the outputs on lines 28 and 30 will not be symmetrical.

A balanced CMOS buffer circuit of the present invention is illustrated in FIG. 2(a) wherein $A_i$ represents an input and where $F = A_i$ and $\overline{F} = \overline{A}_i$ represent non-inverted and inverted outputs, respectively. The buffer circuit includes a CMOS inverter gate 32 formed of a P-channel transistor 34 and a N-channel transistor 36. Node 38 will maintain an inverter logic state with respect to node 40 to which the input logic signal $A_i$ is applied via input terminal 42. A first pair of N-channel MOS transistors Q1, Q2 have their drain electrodes coupled together. A second pair of N-channel MOS transistors Q3, Q4 have their drain electrodes coupled together. The input $A_i$ is applied via the input terminal 42 and node 40 to the gate electrodes of the transistors Q1 and Q4. The inverted input $\overline{A}_i$ is applied via the node 38 to the gate electrodes of the transistors Q2 and Q3. A supply potential $V_{CC}$ is connected to the sources of the transistors Q1 and Q3. The sources of the transistors Q2 and Q4 are connected to a ground potential. A pair of cross-coupled P-channel MOS transistors Q5, Q6 have their source electrodes tied together and to the supply potential $V_{CC}$. The gate electrode of the transistor Q5 is connected to the drain of the transistor Q6 and the gate of the transistor Q6 is connected to the drain of the transistor Q5. The drain of the transistor Q5 is also connected to the common drain of the transistors Q1, Q2 and to the non-inverting output F at line 44. The drain of the transistor Q6 is also connected to the common drain of the transistors Q3, Q4 and to the inverting output $\overline{F}$ at line 46. The inverter gate 32 is not required if the inverted input $\overline{A}_i$ is available from other previous circuits.

FIGS. 2(b) and 2(c) illustrate the waveforms appearing at the outputs on the respective lines 44 and 46. As can be seen, the inverting output signal on line 46 will appear at the same time as the non-inverting output signal on line 44 without any propagation delay time. Thus, the outputs on the lines 44 and 46 will be symmetrical.

Figure 4:
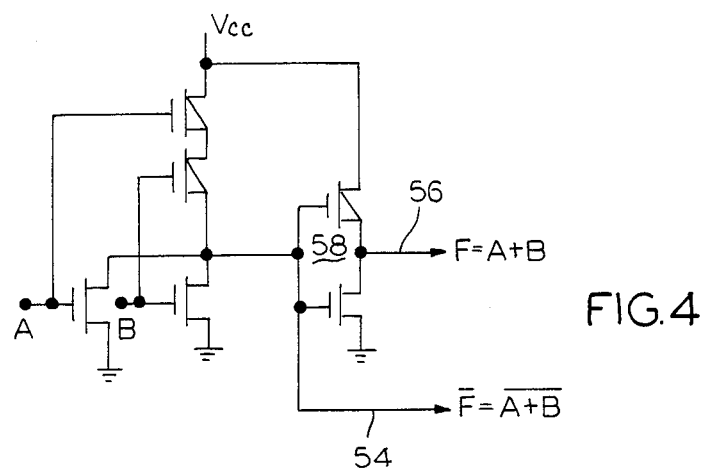
FIG. 4 is a schematic diagram showing an OR logic gate circuit formed of conventional CMOS gate circuits.

In FIG. 3, there is shown a conventional CMOS AND logic gate circuit of the prior art. This is a well-known circuit, wherein A and B represent inputs and wherein $F = AB$ and $\overline{F} = \overline{AB}$ represent respective true and complement outputs. As can be seen, the complement output signal $\overline{F}$ on line 48 will be appearing before the true output signal F on line 50 due to the inherent propagation delay in passing through the CMOS inverter gate 52. In FIG. 4, there is shown a conventional CMOS OR logic gate circuit of the prior art. This is a well-known circuit, wherein A and B represent inputs and wherein $F = A + B$ and $\overline{F} = \overline{A + B}$ represent respective true and complement outputs. As can be seen from FIG. 4, the complement ouput signal F on line 54 will be appearing before the true output signal F on line 56 due to the inherent propagation delay in passing through the CMOS inverter gate 58.

Figures 5A, 5B:
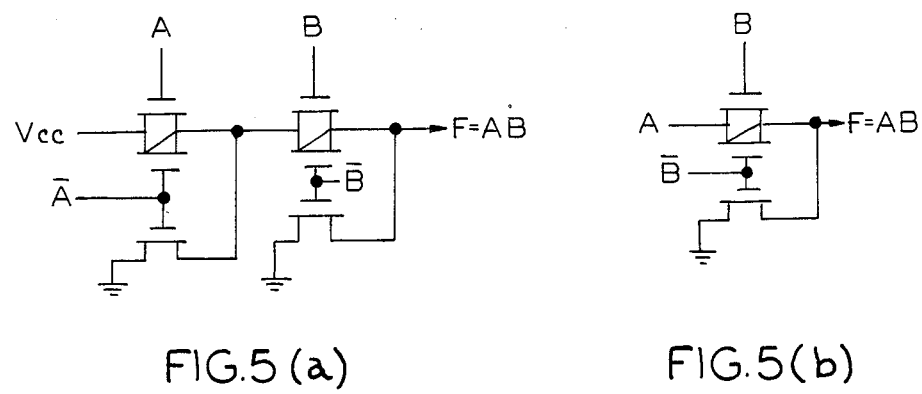
FIGS. 5(a) and 5(b) are schematic diagrams showing AND logic gate circuits formed of conventional transmission gate designs.
Figure 6:
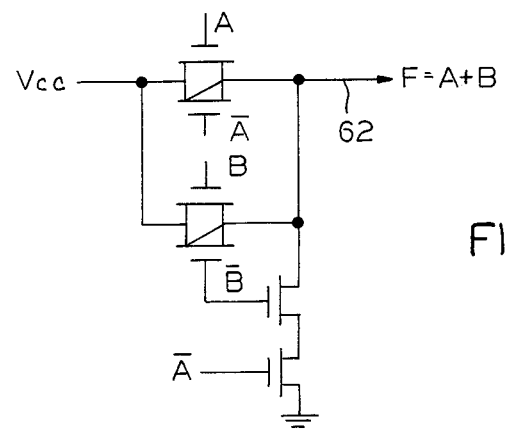
FIG. 6 is a schematic diagram showing an OR logic gate circuit formed of conventional transmission gate designs.

In FIG. 5(a) there is shown a conventional transmission gate AND logic gate circuit of the prior art. This is a well-known circuit wherein A, $\overline{A}$, B, and $\overline{B}$ represent inputs and wherein $F = AB$ represents an output. Thus, the transmission gate design require true and complement input signals. However, it does not produce a complement output signal as in the conventional CMOS design. In FIG. 5(b) there is shown an alternate embodiment of a conventional transmission gate AND logic gate circuit which uses a reduced number of transistors than that of FIG. 5(a). Nevertheless, it also does not produce a complement output signal. In FIG. 6 of the drawings, there is shown a conventional transmission gate OR logic gate circuit of the prior art, wherein A, $\overline{A}$, B, and $\overline{B}$ represent inputs and wherein $F = A + B$ represent an output on line 62. Again, this OR gate circuit does not provide a complement output signal.

Figure 7:
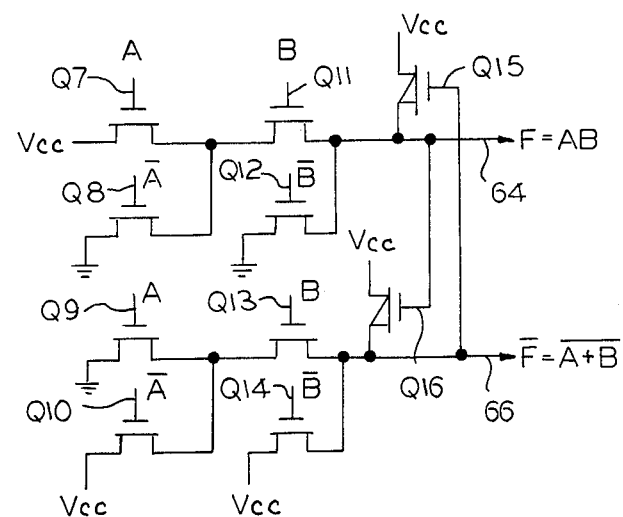
FIG. 7 is a schematic diagram showing an AND logic gate circuit formed of balanced CMOS gate circuits, according to the present invention.

A balanced CMOS AND logic gate circuit of the present invention is illustrated in FIG. 7, wherein A, $\overline{A}$, B and $\overline{B}$ represent inputs and wherein $F = AB$ and $\overline{F} = \overline{AB}$ represent outputs. The AND logic gate circuit includes a first pair of N-channel type MOS transistors Q7, Q8; a second pair of N-channel type MOS transistors Q9, Q10; a third pair of N-channel type MOS transistors Q11, Q12; and a fourth pair of N-channel type MOS transistors Q13, Q14. The true input signal A is applied to the gate of the transistor Q7 of the first pair and to the gate of the transistor Q9 of the second pair. The complement input signal $\overline{A}$ is applied to the gate of the transistor Q8 of the first pair and to the gate of the transistor Q10 of the second pair. A supply potential $V_{CC}$ is connected to the sources of the transistors Q7 and Q10. The sources of the transistors Q8 and Q9 are connected to a ground potential. The true input signal B is applied to the gate of the transistor Q11 of the third pair and to the transistor Q13 of the fourth pair. The complement input signal $\overline{B}$ is applied to the gate of the transistor Q12 of the third pair and to the transistor Q14 of the fourth pair. The source of the transistor Q11 is connected to the drains of the transistors Q7, Q8 and the source of the transistor Q13 is connected to the drains of the transistors Q9, Q10. The source of the transistor Q12 is connected to the ground potential, and the source of the transistor Q14 is connected to the supply potential $V_{CC}$. A pair of cross-coupled P-channel type MOS transistors Q15, Q16 have their sources connected to the supply potential $V_{CC}$. The gate of the transistor Q15 is connected to the drain of the transistor Q16, and the gate of the transistor Q16 is connected to the drain of the transistor Q15. The drain of the transistor Q15 is also connected to the drains of the transistors Q11, Q12 of the third pair and to the true output F on line 64. The drain of the transistor Q16 is also connected to the drains of the transistors Q13, Q14 of the fourth pair and to the complement output $\overline{F}$ on line 66.

Figure 8:
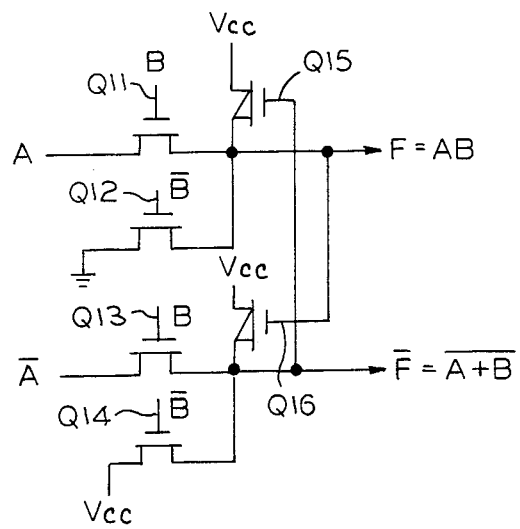
FIG. 8 is an alternate embodiment of the circuit shown in FIG. 7.

While true and complement input signals are required in the balanced CMOS gate circuit of FIG. 7, both true and complement output signals are available essentially at the same time. An alternate embodiment of the balanced CMOS AND logic gate circuit of the present inventin is illustrated in FIG. 8, which requires a lesser number of N-channel transistors than that of FIG. 7. As can be seen, the reduction is due to the elimination of the first and second pair of transistors (Q7 through Q10). Thus, the true input signal A is applied directly to the source of the transistor Q11 and the complement input signal $\overline{A}$ is applied directly to the source of the transistor Q13. Other than this change, this circuit is identical to FIG. 7. It will be understood by those skilled in the art that this is possible only when the inputs are buffered signals. A buffered input signal is defined as one in which there is low impedance to ground in the low level state. Further, it should be apparent that a real "differential" will appear between the true output and complement output since one of the outputs will be near the supply potential $V_{CC}$ and the other output will be near the ground potential due to the pull-up action of the P-channel transistors Q15, Q16.

Figure 9:
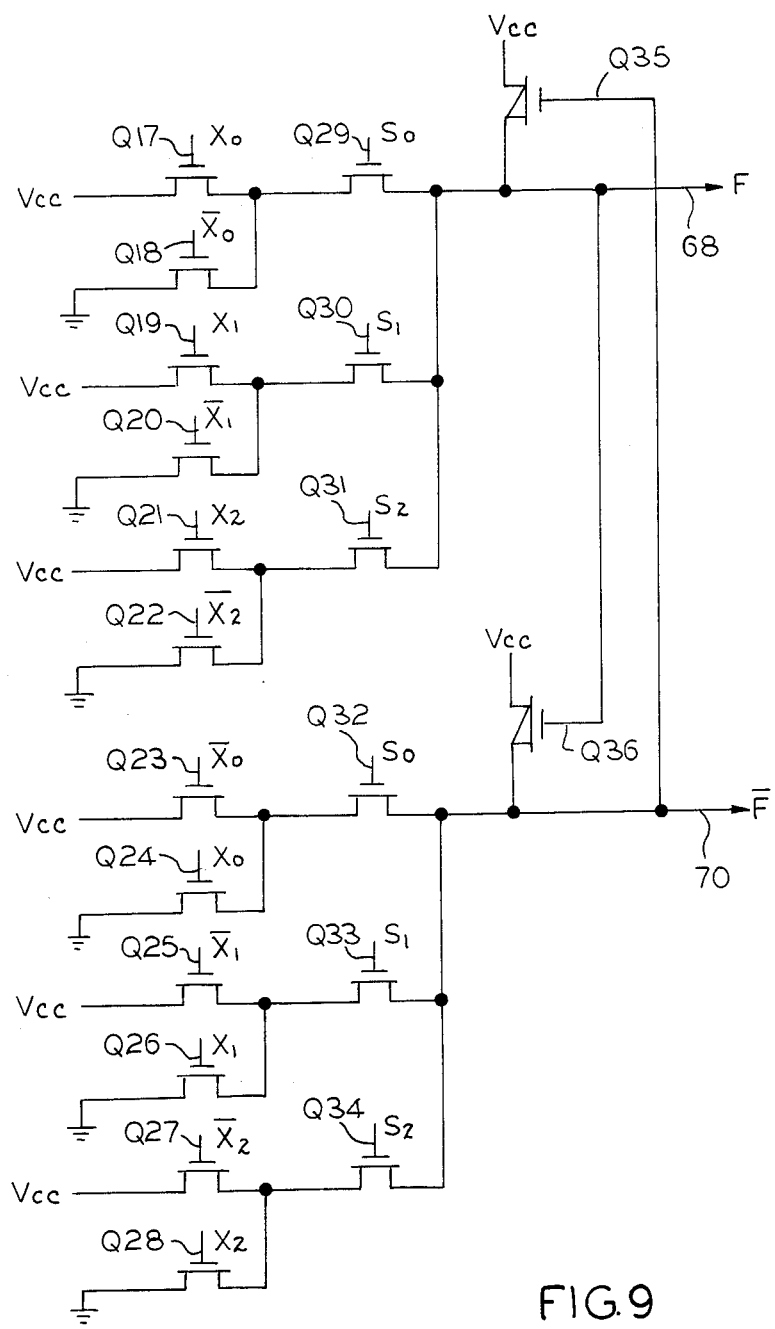
FIG. 9 is a schematic diagram showing a multiplexer circuit formed of balanced CMOS gate circuits, according to the present invention.

A balanced CMOS multiplexer circuit of the present invention is illustrated in FIG. 9. Inputs $X_0$, $X_1$, and $X_2$ represent true data signals and inputs $\overline{X}_0$, $\overline{X}_1$, and $\overline{X}_2$ represent complement data signals. Inputs $S_0$, $S_1$, and $S_2$ represent control signals. Output F on line 68 represents the true output signal which is equal to the logical expression: $S_0X_0+S_1X_1+S_2X_2$, and output $\overline{F}$ on line 70 represents the complement output signal which is equal to the logical expresssion: $S_0X_0+S_1X_1+S_2X_2$. The balanced multiplexer circuit includes a first pair of N-channel MOS transistors Q17, Q18; a second pair of N-channel MOS transistors Q19, Q20; a third pair of N-channel MOS transistors Q21, Q22; a fourth pair of N-channel MOS transistors Q23, Q24; a fifth pair of N-channel MOS transistors Q25, Q26; and a sixth pair of N-channel MOS transistors Q27, Q28. The true data signal $X_0$ is applied to the gate of the transistor Q17 of the first pair and to the gate of the transistor Q24 of the fourth pair. The complement data signal $\overline{X}_0$ is applied to the gate of the transistor Q18 of the first pair and to the gate of the transistor Q23 of the fourth pair. Similarly, the true data signal $X_1$ is applied to the gate of the transistor Q19 of the second pair and to the gate of transistor Q26 of the fifth pair. The complement data signal $\overline{X}_1$ is applied to the gate of the transistor Q20 of the second pair and to the gate of the transistor Q25 of the fifth pair. Further, the true data signal $X_2$ is applied to the gate of the transistor Q21 of the third pair and to the gate of the transistor Q28 of the sixth pair. The complement data signal $\overline{X}_2$ is applied to the gate of the transistor Q22 of the third pair and to the gate of the transistor Q27 of the sixth pair. A supply potential $V_{CC}$ is connected to the sources of the transistors Q17, Q19, Q21, Q23, Q25 and Q27. The sources of the transistor Q18, Q20, Q22, Q24, Q26 and Q28 are connected to a ground potential.

A first group of N-channel control transistors formed of MOS transistors Q29, Q30 and Q31 have their drains connected together. A second group of N-channel control transistors formed of MOS transistors Q32, Q33 and Q34 have their drains connected together. The drains of the transistors in each of the first through sixth pairs are connected together. The common drain of the first pair is also connected to the source of the transistor Q29. Similarly, the common drains of the second through sixth pairs are also connected to the respective sources of the transistors Q30 through Q34. A pair of cross-coupled P-channel MOS transistors Q35 and Q36 have their sources connected to the supply potential $V_{CC}$. The gate of the transistor Q35 is connected to the drain of the transistor Q36 and the gate of the transistor Q36 is connected to the drain of the transistor Q35. The drain of the transistor Q35 is further connected to the common drain of the first group of control transistors Q29, Q30 and Q31 and to the true output F on line 68. The drain of the transistor Q36 is connected to the common drain of the second group of control transistor Q32, Q33 and Q34 and to the complement output $\overline{F}$ on line 70.

Figure 10:
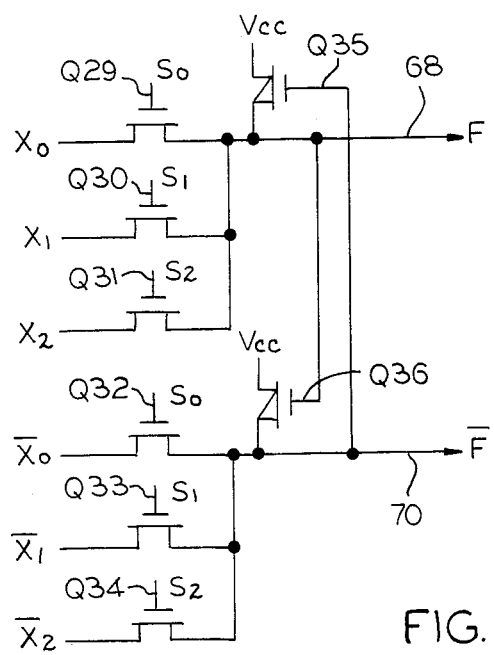
FIG. 10 is an alternate embodiment of the circuit illustrated in FIG. 9.

An alternate embodiment of a balanced CMOS multiplexer circuit of the present invention is depicted in FIG. 10 which requires a lesser number of N-channel transistors than that of FIG. 9. As can be seen, this is due to the elimination of the N-channel transistors in the first through sixth pairs (Q17 through Q28). Thus, the true data signals $X_0$, $X_1$, and $X_2$ are applied directly to the respective sources of the transistors Q29, Q30 and Q31, and the complement data signals $\overline{X}_0$, $\overline{X}_1$ and $\overline{X}_2$ are applied directly to the respective sources of the transistors Q32, Q33 and Q34. Other than this change, this circuit is identical to FIG. 9. Again, this embodiment is possible only when the inputs are strong signals.

Figure 11:
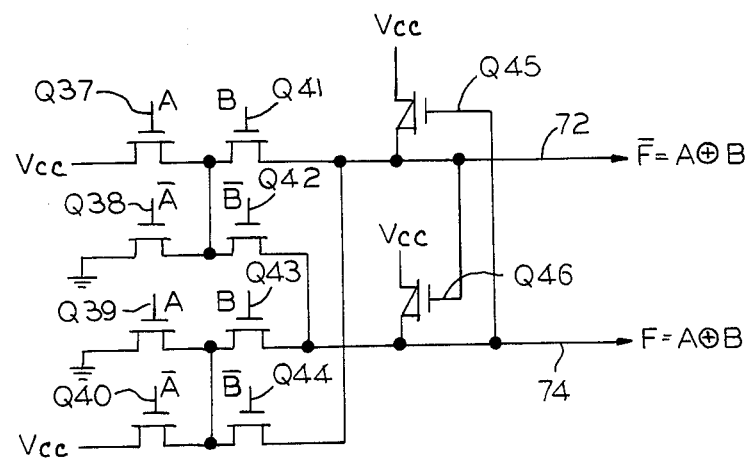
FIG. 11 is a schematic diagram showing an EXCLUSIVE OR circuit formed of balanced CMOS gate circuits, according to the present invention.

A balanced CMOS EXCLUSIVE OR logic gate circuit of the present invention is depicted in FIG. 11 where A, $\overline{A}$, B and $\overline{B}$ represent inputs and wherein $F=A\oplus B$ and $F=A \oplus B$ represent outputs. The enclosed plus sign means "EXCLUSIVE-OR". The OR logic gate circuit includes a first pair of N-channel MOS transistors Q37, Q38; a second pair of N-channel MOS transistors Q39, Q40; a third pair of N-channel MOS transistors Q41, Q42; and a fourth pair of N-channel os transistors Q43, Q44. The true input signal A is applied to the gate of the transistors Q37 and Q39. The complement input signal $\overline{A}$ is applied to the gates of the transistors Q38 and Q40. A supply potential $V_{CC}$ is applied to the sources of the transistors Q37 and Q40. The sources of the transistors Q38 and Q39 are tied to a ground potential. The true input signal B is applied to the gates of the transistors Q41 and Q43. The complement input signal $\overline{B}$ is applied to the gates of the transistors Q42 and Q44. The drains of the transistors Q37 and Q38 are tied together and further connected to the sources of the transistors Q41 and Q42. The drains of the transistors Q39 and Q40 are tied together and further connected to the sources of the transistors Q43 and Q44. A pair of cross-coupled P-channel MOS transistors Q45 and Q46 have their sources connected to the supply potential $V_{CC}$. The gate of the transistor Q45 is connected to the drain of the transistor Q46 and the gate of the transistor Q46 is connected to the drain of the transistor Q45. The drain of the transistor Q45 is also tied to the drains of the transistors Q41 and Q44 and to the complement output $\overline{F}$ on line 72. The drain of the transistor Q46 is also tied to the drains of the transistors Q42 and Q43 and to the true output F on line 74.

Figure 12A:
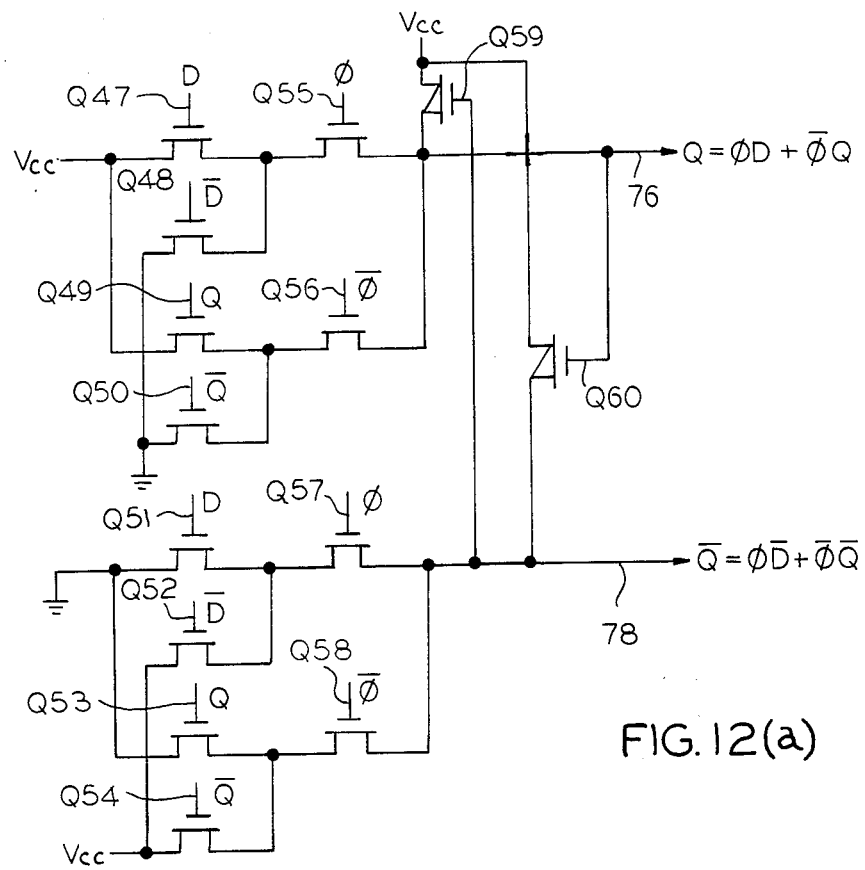
FIG. 12(a) is a schematic diagram showing a D-type flip-flop circuit formed of balanced CMOS gate circuits, according to the present invention.

In FIG. 12(a) there is shown a balanced CMOS D-type latch or flip-flop circuit. D, $\overline{D}$ represent inputs, $\emptyset$, $\overline{\emptyset}$ represent clock signals; and $Q=\emptyset D+\overline{\emptyset}Q$, $\overline{Q}=\emptyset\overline{D}+\overline{\emptyset}\overline{Q}$ represent outputs. The D-type flip-flop circuit includes a first pair of N-channel MOS transistors Q47, Q48; a second pair of N-channel MOS transistors Q49, Q50; a third pair of N-channel MOS transistors Q51, Q52; and a fourth pair of N-channel MOS transistors Q53, Q54. The true input D is applied to the gates of the transistors Q47 and Q51. The complement input $\overline{D}$ is applied to the gates of the transistors Q48 and Q52. The true output Q on line 76 is applied as an input to the gates of the transistors Q49 and Q53. The complement output $\overline{Q}$ on line 78 is applied as an input to the gates of the transistors Q50 and Q54. A supply potential $V_{CC}$ is connected to the sources of the transistors Q47, Q49, Q52 and Q54. The sources of the transistors Q48, Q50, Q51 and Q53 are tied to a ground potential. A first pair of N-channel clock transistors formed of MOS transistors Q55 and Q56 have their drains connected together. A second pair of N-channel clock transistors formed of MOS transistors Q57 and Q58 have their drains connected together. The true clock signal $\emptyset$ is applied to the gates of the transistors Q55 and Q57. The complement clock signal $\emptyset$ is applied to the gate of the transistor Q56 and Q58. The source of the transistor Q55 is connected to the drains of the transistors Q47 and Q48. The source of the transistor Q56 is connected to the drains of the transistors Q49 and Q50. The source of the transistor Q57 is connected to the drains of the transistor Q51 and Q52. The source of the transistor Q58 is connected to the drains of the transistor Q53 and Q54. A pair of cross-coupled P-channel MOS transistors Q59 and Q60 have their drains connected to the supply potential $V_{CC}$. The gate of the transistor Q59 is connected to the drain of the transistor Q60 and the gate of the transistor Q60 is connected to the drain of the transistor Q59. The drain of the transistor Q59 is also connected to the common drain of the transistors Q55, Q56 and to the true output Q on the line 76. The drain of the transistor Q60 is also connected to the common drain of the transistors Q57, Q58 and to the complement output $\overline{Q}$ on the line 78.

Figure 12B:
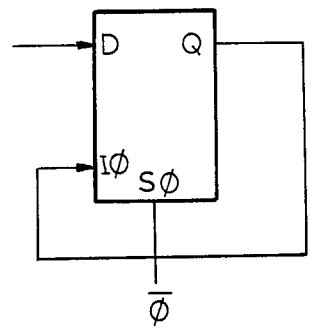
FIG. 12(b) depicts the circuit of FIG. 12(a) in block diagram form.
Figure 12C:
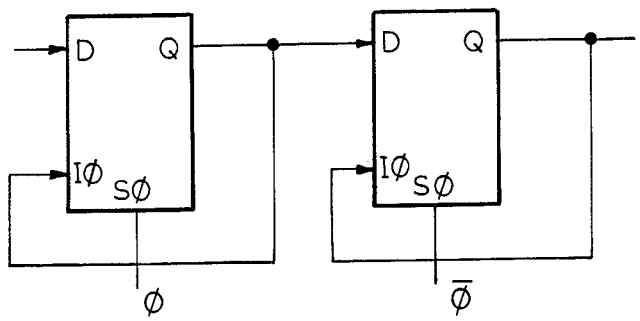
FIG. 12(c) is a block diagram of a master-slave D-type flip-flop circuit of the present invention which is illustrated in block diagram form.

In FIG. 12(b) there is shown a representation of the circuit of FIG. 12(a) in block diagram form. Two D-type flip-flop circuits of FIG. 12(a) are shown in FIG. 12(c) which is utilized to form a master-slave D-type flip-flop circuit.

Accordingly, the various balanced CMOS logic gate circuits of the present invention have advantages over the prior art which are listed as follows:

(1) they use mostly N-channel transistors which occupy less space area;

(2) they are fully static circuits for combinational logic;

(3) they consume no DC power;

(4) they have a high speed of operation similar to transmission gate logic circuits; and (5) they have topological regularity which simplify their layout on integrated circuit substrates.

From the foregoing detailed description, it can thus be seen that the present invention provides balanced CMOS logic gate circuits which are arranged on an integrated substrate with topological regularity so as to require a lesser amount of integrated surface area. By utilizing an integrated circuit with less surface area, the implementation of the various balanced CMOS logic gate circuits on such a substrate will minimize routing of interconnecting leads, thereby improving on the speed of operation.

While there has been illustrated and described what are at present to be preferred embodiments of the present invention, it will be understood by those skilled in the art that various modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention but that the invention will include all embodiments falling within the scope of the appended claims.

What is claimed is:

1. A balanced CMOS AND logic gate circuit comprising:

a first pair of N-channel type MOS transistors formed of first and second transistors whose drains are connected together;

a second pair of N-channel type MOS transistors formed of third and fourth transistors whose drains are connected together;

a third pair of N-channel type MOS transistors formed of fifth and sixth transistors whose drains are connected together;

a fourth pair of N-channel type MOS transistors formed of seventh and eighth transistors whose drains are connected together;

a supply potential being connected to the sources of said first, fourth and eighth transistors;

a ground potential being connected to the sources of said second, third and sixth transistors;

the source of said fifth transistor being connected to the drains of said first and second transistors;

the source of said seventh transistor being connected to the drains of said third and fourth transistors;

a first true input signal being applied via a first input terminal to the gates of the first and third transistors;

a complement of said first input signal being applied via a second input terminal to the gates of said second and fourth transistors;

a second true input signal being applied via a third input terminal to the gates of said fifth and seventh transistors;

a complement of said second input signal being applied via a fourth input terminal to the gates of said sixth and eighth transistors;

a pair of cross-coupled P-channel type MOS transistors formed of ninth and tenth transistors whose sources are coupled to the supply potential, the gate of said ninth transistor being connected to the drain of said tenth transistor and the gate of said tenth transistor being connected to the drain of said ninth transistor;

the drain of said ninth transistor being further connected to the drains of said fifth and sixth transistors and to a true output terminal; and the drain of said tenth transistor being further connected to the drains of said seventh and eighth transistors and to a complement output terminal.

2. A logic gate as claimed in claim 1, wherein true and complement output signals are generated at the respective true and complement output terminals at the same time.

3. A logic gate circuit as claimed in claim 1, wherein all of said first through tenth transistors are arranged on an integrated circuit substrate with topological regularity so as to simplify their layout.

4. A balanced CMOS AND logic gate circuit comprising:
- a first pair of N-channel type MOS transistors formed of first and second transistors whose drains are connected together;
- a second pair of N-channel type MOS transistors formed of third and fourth MOS transistors whose drains are connected together;
- a supply potential being connected to the source of said fourth transistor;
- a ground potential being connected to the source of said second transistor;
- a first true input signal being applied via a first input terminal to the source of said first transistor;
- a complement of said first input signal being applied via a second input terminal to the source of said third transistor;
- a second true input signal being applied via a third input terminal to the gates of said first and third transistors;
- a second complement of said second input signal being applied via a fourth input terminal to the gates of said second and fourth transistors;
- a pair of cross-coupled P-channel type MOS transistors formed of fifth and sixth transistors whose sources are coupled to the supply potential, the gate of said fifth transistor being connected to the drain of said sixth transistor and the gate of said sixth transistor being connected to the drain of said fifth transistor;
- the drain of said fifth transistor being further connected to the drains of said first and second transistors and to a true output terminal; and
- the drain of said sixth transistor being further connected to the drains of said third and fourth transistors and to a complement output terminal.

5. A logic gate circuit as claimed in claim 4, wherein true and complement output signals are generated at the respective true and complement output terminals at the same time.

6. A logic gate circuit as claimed in claim 4, wherein all of said first through sixth transistors are arranged on an integrated circuit substrate with topological regularity so as to simplify their layout.

7. A logic gate circuit composed of CMOS transistors comprising:
- a first pair of transistors formed of first and second transistors of one conductivity type having gate, source and drain electrodes;
- a second pair of transistors formed of third and fourth transistors of the same conductivity type as said first pair and having gate, source and drain electrodes;
- a supply potential being connected to the sources of said first and third transistors;
- a ground potential being connected to the sources of said second and fourth transistors;
- an input signal being applied via a first input terminal to the gates of said first and fourth transistors;
- a complement of said input signal being applied via a second input terminal to the gates of said second and third transistors;
- a first pair of cross-coupled transistors formed of fifth and sixth transistors of a complementary conductivity type and having gate, source and drain electrodes, the gate of said fifth transistor being connected to the drain of said sixth transistor and the gate of the sixth transistor being connected to the drain of said fifth transistor;
- the sources of said fifth and sixth transistor being coupled to the supply potential;
- the drain of said fifth transistor being further connected to the drains of said first and second transistors and to a true output terminal; and
- the drain of said sixth transistor being further connected to the drains of said third and fourth transistors and to a complement output terminal.

8. A logic gate circuit as claimed in claim 7, wherein said first through fourth transistors are N-channel type MOS transistors and said fifth and sixth transistors are P-channel type MOS transistors.

9. A logic gate circuit as claimed in claim 7, wherein true and complement output signals are generated at the respective true and complement output terminals at the same time.

10. A logic circuit as claimed in claim 7, wherein all of said first through sixth transistors are arranged on an integrated circuit substrate with topological regularity so as to simplify their layout.

* * * * *